(12) United States Patent
Roy et al.

(10) Patent No.: US 9,558,800 B2
(45) Date of Patent: Jan. 31, 2017

(54) NON-VOLATILE RANDOM ACCESS MEMORY (NVRAM)

(71) Applicant: FREESCALE SEMICONDUCTOR, INC., Austin, TX (US)

(72) Inventors: Anirban Roy, Austin, TX (US); Thomas Jew, Austin, TX (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 14/788,273

(22) Filed: Jun. 30, 2015

(65) Prior Publication Data

US 2017/0004867 A1    Jan. 5, 2017

(51) Int. Cl.
 G11C 5/06      (2006.01)
 G11C 11/16     (2006.01)
 G11C 11/15     (2006.01)

(52) U.S. Cl.
 CPC .............. G11C 11/161 (2013.01); G11C 11/15 (2013.01); G11C 11/1673 (2013.01); G11C 11/1675 (2013.01)

(58) Field of Classification Search
 CPC ............... G11C 11/161; G11C 11/1673; G11C 11/1675; G11C 11/15
 USPC ......................................... 365/72, 148, 158
 See application file for complete search history.

(56) References Cited

U.S. PATENT DOCUMENTS

| | | | |
|---|---|---|---|
| 8,385,108 B1 | 2/2013 | Abedifard et al. | |
| 8,634,232 B2 | 1/2014 | Oh | |
| 2008/0239796 A1* | 10/2008 | Aoki | B82Y 10/00 365/158 |
| 2008/0298113 A1* | 12/2008 | Liu | G11C 13/0004 365/148 |
| 2011/0007549 A1* | 1/2011 | Wan | G11C 7/18 365/148 |
| 2011/0122674 A1 | 5/2011 | Lin et al. | |
| 2012/0128805 A1* | 5/2012 | Clement | A61K 9/0053 424/750 |
| 2012/0243297 A1* | 9/2012 | Katayama | G11C 11/1659 365/148 |

FOREIGN PATENT DOCUMENTS

| | | | |
|---|---|---|---|
| EP | 1426966 B1 | 9/2004 | |
| EP | 1426966 B1 | 2/2009 | |

OTHER PUBLICATIONS

Aoki et al, "A novel voltage sensing 1T/2MTJ cell with resistance ratio for highly stable and scalable MRAM", Symposium on VLSI Circuits, Digest of Technical Papers, Jun. 16-18, 2005, pp. 170-171, IEEE.

(Continued)

Primary Examiner — Toan Le

(57) ABSTRACT

A non-volatile memory device includes an array of non-volatile memory cells. A memory cell in the array of memory cells includes a first resistive element including a first terminal and a second terminal, a second resistive element including a first terminal and a second terminal, and a select transistor including a gate electrode coupled to a word line, a first current electrode coupled to the first terminal of the first resistive element and the first terminal of the second resistive element, and a second current electrode coupled to a bit line. The second terminal of the first resistive element is coupled to a first source line, and the second terminal of the second resistive element is coupled to a second source line.

19 Claims, 3 Drawing Sheets

(56) References Cited

OTHER PUBLICATIONS

Chung et al, "Fully integrated 54nm STT-RAM with the smallest bit cell dimension for high density memory application", IEEE International Electron Devices Meeting (IEDM), Dec. 6-8, 2010, pp. 12.7.1-12.7.4, San Francisco, CA.
Yu et al, "New Circuit Design Architecture for a 300-MHz 40 nm 1Mb Embedded STT-MRAM with Great Immunity to PVT Variation", International Conference on Solid-State and Integrated Circuit (ICSIC), 2012, pp. 57-61, vol. 32, IACSIT Press, Singapore.
Tsuchida et al, "A 64Mb MRAM with Clamped-Reference and Adequate-Reference Schemes", IEEE International Solid-State Circuits Conference Digest of Technical Papers (ISSSCC), Feb. 7-11, 2010, pp. 258-259, San Francisco, CA.
Chen et al, "A nondestructive self-reference scheme for Spin-Transfer Torque Random Access Memory (STT-RAM), Design, Automation & Test in Europe Conference & Exhibition", Mar. 8-12, 2010, pp. 148-154, Dresden.

\* cited by examiner

NON-VOLATILE RANDOM ACCESS MEMORY (NVRAM)

BACKGROUND

Field

This disclosure relates generally to integrated circuits, and more particularly, to non-volatile random access memories (NVRAMs).

Related Art

Non-volatile memories (NVMs) have become very important in a variety of applications but typically have characteristics that make them difficult to use as a random access memory. Some of the difficulties are very slow program and erase times, inability to erase one bit at a time, and high voltage requirements for program and erase. Some of the resistive NVMs, such as magnetoresistive tunnel junctions (MTJs) overcome these difficulties making them a candidate for use as a random access memory (RAM). Other difficulties such as large space requirements make this less attractive.

Accordingly there is a need to provide further improvement in obtaining NVRAMs.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

Shown in FIG. 1 is a block diagram of a NVRAM;

Figure 1:
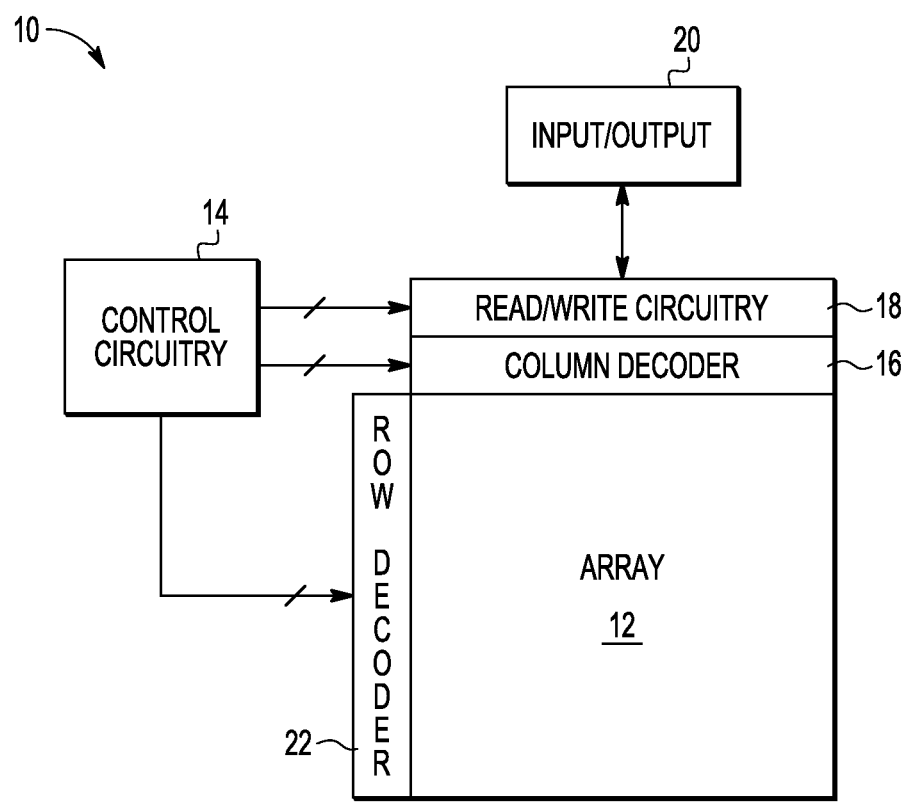
Figure 2:
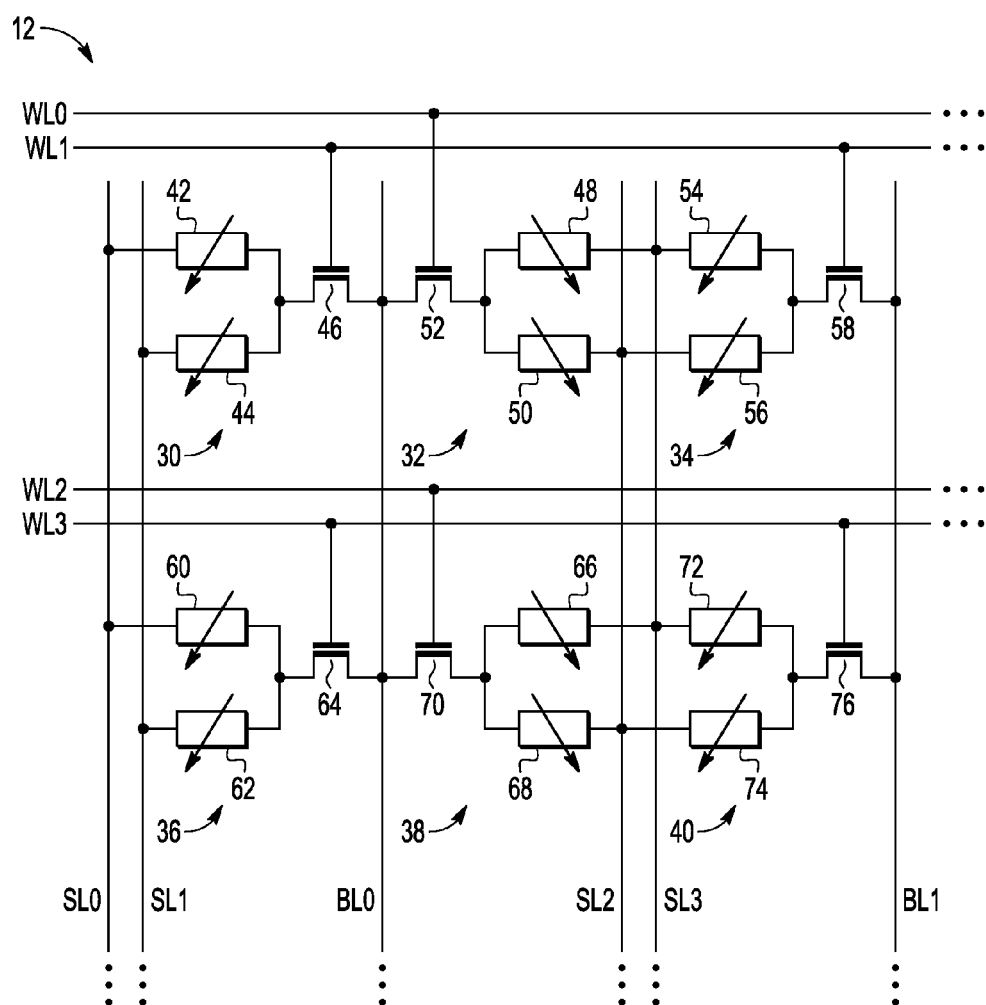
Figure 3:
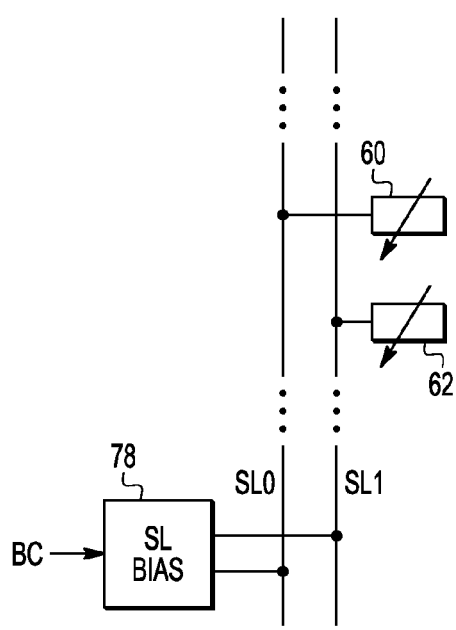
Figure 4:
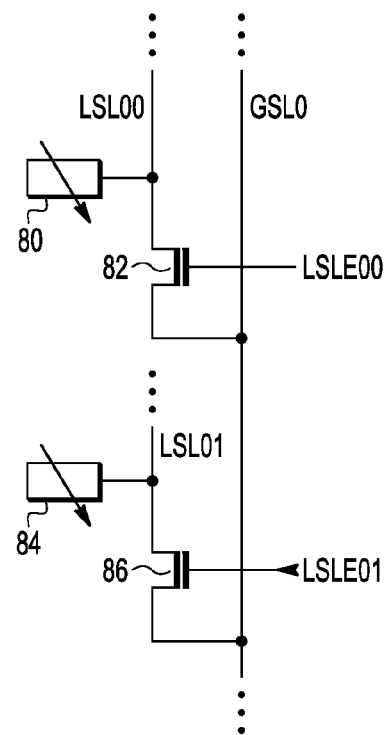

Shown in FIG. 2 is a circuit diagram of a portion of an array of the NVRAM of FIG. 1;

Shown in FIG. 3 is a circuit diagram of a portion of the portion shown in FIG. 2; and Shown in FIG. 4 is an alternative to a portion of the portion shown in FIG. 2.

DETAILED DESCRIPTION

In one aspect, a non-volatile random access memory cell has two bits of information that can be accessed on a single bit line. The two bits are achieved using two resistive RAM cells that have a common connection to an access transistor, which is connected to a bit line, and separate connections to a pair of source lines. This is better understood by reference to the drawings and the following written description.

Shown in FIG. 1 is non-volatile random access memory (NVRAM) 10 having an array 12, control circuitry 14, a column decoder 16 coupled to array 12 and control circuitry 14, read/write circuitry 18 coupled to the column decoder and read/write circuitry 18, an input/output 20 coupled to read/write circuitry 18 and control circuitry 14, and a row decoder 22 coupled to array 12 and control circuitry 14. Array 12 is accessed under the control of control circuitry 14 which directs the operations of row decoder 22, column decoder 16, and read/write circuitry 18. Control circuitry 14 provides addresses and control signals for this purpose. Memory cells in array 12 are selected for reading or writing row decoder 22 and column decoder 16. Read/write circuitry 18 performs the reading and writing. Input/output 20 provides data signals to read/write circuitry 18 and receives data signals from read/write circuitry 18, Shown in FIG. 2 is a portion of array 12 having word lines WL0, WL1, WL2, and WL3; bit lines BL0 and BL1; source lines SL0, SL1, SL2, and SL3; and NV 2-bit cells 30, 32, 34, 36, 38, and 40. NV 2-bit cell 30 has a resistive NV cell 42, a transistor 46, and a resistive NV cell 44. NV 2-bit cell 32 has a resistive NV cell 48, a transistor 52, and a resistive NV cell 50. NV 2-bit cell 34 has a resistive NV cell 54, a transistor 58, and a resistive NV cell 56. NV 2-bit cell 36 has a resistive NV cell 60, a transistor 64, and a resistive NV cell 62. NV 2-bit cell 38 has a resistive NV cell 66, a transistor 70, and a resistive NV cell 68. NV 2-bit cell 40 has a resistive NV cell 72, a transistor 76, and a resistive NV cell 74. Writing of resistive NV cells 42, 44, 48, 50, 54, 56, 60, 62, 66, 68, 72, and 74 is by applying a current in a first direction, toward the source line to which it is connected, to obtain a relatively high resistance and from the source line to which it is connected to obtain a relatively low resistance.

Resistive NV cell 42 has a first terminal connected to source line SL0 and a second terminal. Resistive NV cell 44 has a first terminal connected to source line SL1 and a second terminal connected to the second terminal of resistive NV cell 42. Transistor 46 has a first current electrode connected to the second current electrodes of resistive NV cells 42 and 44, a second current electrode connected to bit line BL0, and a gate connected to word line WL1. NV 2-bit cells 32, 34, 36, 38, and 40 are connected in the same way as NV 2-bit cell 30 except to different bit lines, source lines, and word lines. Transistors 52, 58, 64, 70, and 76 have their gates connected to word lines WL0, WL1, WL3, WL2, and WL3, respectively. Resistive NV cells 48, 50, 54, 56, 60, 62, 66, 68, 72, and 74 have their first terminals connected to source lines SL3, SL2, SL3, SL2, SL0, SL1, SL3, SL2, SL3, and SL2, respectively. Transistors 52, 58, 64, 70, and 76 have their second current electrodes connected to bit lines BL0, BL1, BL0, BL0, and BL1, respectively. One row (30, 32, 34) of memory cells includes NV 2-bit cells 30, 32, and 34 and another row (36, 38, 40) includes NV 2-bit cells 36, 38, and 40.

Shown in FIG. 3 is a source line (SL) bias 78 coupled to source lines SL0 and SL1 that is for providing a bias to a source line that is coupled to a resistive NV cell in the same resistive NV 2-bit cell as a resistive NV cell that is being programmed or being read. In the case of resistive NV cell 60, which is connected to source line SL0, being read or programmed, SL bias 78 applies the desired bias to source line SL1 as controlled by bias control signal BC. Signal BC originates with control circuitry 14 and may be routed through row decoder 22 or column decoder 16.

For an example of operation, NV 2-bit cell 30 will be used. For programming resistive NV cell 42 to a logic high which may also be called writing a logic high, a logic high is applied to bit line BL0, a logic high is applied to word line WL1, a logic low is applied to source line SL0, and a bias, lower in voltage than the logic high applied to bit line BL0, is applied to source line SL1. A logic high in this usage is a relatively high voltage compared to the voltage for a logic low. A logic high may also be called a '1' and a logic low a '0.' Under these conditions, transistor 46 is conductive and current flows from bit line BL0 to through transistor 46 and resistive NV cell 42 to source line SL0. This causes resistive NV cell 42 to be in its high resistive state which is the logic high state. The bias applied to source line SL1 prevents to prevent too much current from flowing through resistive NV cell 44. An effective voltage for this bias is one half of the logic high applied to bit line BL0. This limits the current through resistive NV cell 44 to well under a half of the current through resistive NV cell 42. Similarly for deselected cells along source lines SL0 and SL1 such as resistive NV cells 60 and 62 there is a voltage differential between source lines SL0 and SL1 of about one half the logic high voltage so that current through any deselected resistive NV cell will be a quarter or less than the current through the selected resistive NV cell. For example, assuming a logic high at a power supply voltage VDD so that source line SL1 is at ½ VDD and source line SL0 is at ground, the most voltage across resistive NV cells 60 and 62 is ½ VDD so that only ¼ VDD is across one of them. Regarding deselected resistive NV cell 44, the drop across transistor 46 may be ¼ VDD so that ¾ VDD is across resistive NV cell 42 which would be three times the amount across resistive NV cell 44. If resistive NV cell 44 is in its low resistance state, more current would flow but the current direction would be consistent with keeping it in the low resistance state. The particular bias for the deselected source line will likely need to be optimized by experiment and perhaps sizing of the select transistors such as transistor 46. The resistive NV cells that are coupled to pairs of source lines that are not selected are not at risk because both source lines are held to the same voltage, which may be ground and the select transistor is non-conductive receiving a logic low on its gate.

For the case of writing a logic low into resistive NV cell 42, a logic high is applied to source line SL0, a logic low is applied to bit line BL0, and a logic high is applied to word line WL1. A bias of ½ VDD can again be applied to source line SL1. Current passes from source line SL0 and through resistive NV cell 42 and transistor 46 to bit line BL0 so that resistive NV cell 42 is ensured of being a logic low in its low resistance state. With the bias of ½ VDD present on source line SL1, sufficient current to cause programming of resistive NV cells 44, 60, and 62 can be prevented.

Reading the state of resistive NV cell 42 is achieved by applying a read voltage, which is significantly lower than the write voltage, to source line SL0 while applying the bias of read voltage to the unselected source line, which is SL1 in this case. Word line WL1 may be pulsed so that bit line BL0 will provide a pulse in response. This may be more effective than providing a steady current in avoiding altering the state of the resistive NV cell while being read. Bias applied to the deselected source line is also important for the read. A voltage applied to source line SL0 will be coupled to source line SL1 through unselected resistive NV cells such as resistive NV cells 60 and 62.

Shown in FIG. 4 is a segmented source line system having a global source line GSL0, a source line segment LSL00, a source line segment LSL01, a transistor 82, a transistor 86, a resistive NV cell 80, and a resistive NV cell 84. Global source line GSL0 carries the select connected signal but current is mostly carried by segments LSL00 and LSL01 only one of which is connected to global source line GSL0 at any given point in time. Resistive NV cell 80 is connected to segment LSL00 and resistive NV cell 84 is connected to segment LSL01. Transistor 82, which may be referenced as a segmentation transistor, selectively couples segment LSL00 to global source line GSL0 in response to a signal LSLE00 becoming a logic high, and transistor 86, which may also be referenced as a segmentation transistor, selectively couples segment LSL01 to global source line GSL0 in response to a signal LSLE01 becoming a logic high. This prevents excessive current from accumulating along a source line because only a segment is coupled to a global source line GSL0 at any given point in time.

Thus it is seen that a 2-bit cell, which is very effective in avoiding requiring excessive space and making it realistic to have a RAM that is non-volatile and that does not require excessive space.

Thus it is seen that even with relatively small differences between a relatively high resistance and a relatively low resistance, using two non-volatile elements can be effective in obtaining a more robust logic high and logic low.

By now it should be appreciated that there has been disclosed a non-volatile memory device including an array of non-volatile memory cells. A memory cell in the array of non-volatile memory cells includes a first resistive element including a first terminal and a second terminal. The memory cell further includes a second resistive element including a first terminal and a second terminal. The memory cell further includes a select transistor including a gate electrode coupled to a word line, a first current electrode coupled to the first terminal of the first resistive element and the first terminal of the second resistive element, and a second current electrode coupled to a bit line. The second terminal of the first resistive element is coupled to a first source line, and the second terminal of the second resistive element is coupled to a second source line. The non-volatile memory device may have a further characterization by which the first and second resistive elements are magnetic tunnel junction resistors. The non-volatile memory device may have a further characterization by which to write a '1' in the first resistive element, voltage on the word line is pulsed, voltage on the first source line is lower in magnitude than voltage on the second source line, and voltage on the second source line is lower in magnitude than voltage at the bit line. The non-volatile memory device may have a further characterization by which to write a '0' in the first resistive element, voltage on the word line is pulsed, voltage on the first source line is higher in magnitude than voltage on the second source line, and voltage on the second source line is higher in magnitude than voltage at the bit line. The non-volatile memory device may have a further characterization by which to write a '1' in the second resistive element, voltage on the word line is pulsed, voltage on the second source line is higher in magnitude than voltage on the first source line, and voltage on the second source line is lower in magnitude than voltage at the bit line. The non-volatile memory device may have a further characterization by which to write a '0' in the second resistive element, voltage on the word line is pulsed, voltage on the second source line is higher in magnitude than voltage on the first source line, and voltage on the first source line is higher in magnitude than voltage at the bit line. The non-volatile memory device may further include a first segmentation transistor including a first current electrode coupled to the first source line, a second current electrode coupled to a global source line, and a control electrode coupled to a first local source line enable signal, wherein the first segmentation transistor couples the first source line to the global source line when the first local source line enable signal is set to place the first segmentation transistor in a conductive mode. The non-volatile memory device may further include a second segmentation transistor including a first current electrode coupled to the second source line, a second current electrode coupled to the global source line, and a control electrode coupled to a second local source line enable signal, wherein the second segmentation transistor couples the second source line to the global source line when the second local source line enable signal is set to place the second segmentation transistor in a conductive mode. The non-volatile memory device may have a further characterization by which to read the first resistive element, a read voltage is applied on the bit line and the second source line, and a voltage lower in magnitude than the read voltage is applied at the first source line. The non-volatile memory device may have a further characterization by which to read the second resistive element, a read voltage is applied on the bit line and the first source line, and a voltage lower in magnitude than the read voltage is applied at the second source line.

Also disclosed is an integrated circuit including an array of non-volatile memory cells including a first row of memory cells and a first column of memory cells, wherein each memory cell in the array of memory cells is configured to store two bits of information. The integrated circuit further includes a select transistor including a control gate coupled to a first word line and a first current electrode coupled to a first bit line, a first resistive element including a first terminal coupled to a second current electrode of the select transistor and a second terminal coupled to a first source line, and a second resistive element including a first terminal coupled to the second current electrode of the select transistor and a second terminal coupled to a second source line. The integrated circuit may further include a second memory cell in the first row and the non-volatile second column that includes a select transistor including a control gate coupled to a second word line and a first current electrode coupled to the first bit line, a first resistive element including a first terminal coupled to a second current electrode of the select transistor and a second terminal coupled to a third source line, and a second resistive element including a first terminal coupled to the second current electrode of the select transistor and a second terminal coupled to a fourth source line. The integrated circuit may further include a third memory cell in a second row of memory cells and the first column that includes a select transistor including a control gate coupled to a third word line and a first current electrode coupled to the first bit line, a first resistive element including a first terminal coupled to a second current electrode of the select transistor and a second terminal coupled to the first source line, and a second resistive element including a first terminal coupled to the second current electrode of the select transistor and a second terminal coupled to the second source line. The integrated circuit may have a further characterization by which the first and second resistive elements in the first, second, and third memory cells are magnetic tunnel junction resistors. The integrated circuit may have a further characterization by which to write a '1' in the first resistive element of the first memory cell, voltage on the first word line is pulsed, voltage on the first source line is lower in magnitude than voltage on the second source line, and voltage on the second source line is lower in magnitude than voltage at the first bit line and to write a '0' in the first resistive element of the first memory cell, voltage on the first word line is pulsed, voltage on the first source line is higher in magnitude than voltage on the second source line, and voltage on the second source line is higher in magnitude than voltage at the first bit line. The integrated circuit may have a further characterization by which to write a '1' in the first resistive element of the second memory cell, voltage on the second word line is pulsed, voltage on a third source line is lower in magnitude than voltage on a fourth source line, and voltage on the fourth source line is lower in magnitude than voltage at the first bit line and to write a '0' in the first resistive element of the second memory cell, voltage on the second word line is pulsed, voltage on the third source line is higher in magnitude than voltage on the fourth source line, and voltage on the fourth source line is higher in magnitude than voltage at second bit line. The integrated circuit may have a further characterization by which to write a '1' in the first resistive element of the third memory cell, voltage on the third word line is pulsed, voltage on the first source line is lower in magnitude than voltage on the second source line, and voltage on the second source line is lower in magnitude than voltage at the first bit line and to write a '0' in the first resistive element of the third memory cell, voltage on the third word line is pulsed, voltage on the first source line is higher in magnitude than voltage on the second source line, and voltage on the second source line is higher in magnitude than voltage at the first bit line. The integrated circuit may further include a first segmentation transistor including a first current electrode coupled to the first source line, a second current electrode coupled to a global source line, and a control electrode coupled to a first local source line enable signal, wherein the first segmentation transistor couples the first source line to the global source line when the first local source line enable signal is set to place the first segmentation transistor in a conductive mode and a second segmentation transistor including a first current electrode coupled to the second source line, a second current electrode coupled to the global source line, and a control electrode coupled to a second local source line enable signal, wherein the second segmentation transistor couples the second source line to the global source line when the second local source line enable signal is set to place the second segmentation transistor in a conductive mode. The integrated circuit may have a further characterization by which to read the first resistive element of the first memory cell, a supply voltage is applied at the control gate of the select transistor of the first memory cell, a read voltage is applied on the first bit line and the second source line, and a voltage lower in magnitude than the read voltage is applied at the first source line, to read the second resistive element of the first memory cell, the supply voltage is applied at the control gate of the select transistor of the first memory cell, the read voltage is applied on the first bit line and the first source line, and a voltage lower in magnitude than the read voltage is applied at the second source line, to read the first resistive element of the second memory cell, the supply voltage is applied at the control gate of the select transistor of the second memory cell, the read voltage is applied on the first bit line and the fourth source line, and a voltage lower in magnitude than the read voltage is applied at the third source line, to read the second resistive element of the second memory cell, the supply voltage is applied at the control gate of the select transistor of the second memory cell, the read voltage is applied on the first bit line and the third source line, and a voltage lower in magnitude than the read voltage is applied at the fourth source line, to read the first resistive element of the third memory cell, the supply voltage is applied at the control gate of the select transistor of the third memory cell, the read voltage is applied on the first bit line and the second source line, and a voltage lower in magnitude than the read voltage is applied at the first source line, and to read the second resistive element of the third memory cell, the supply voltage is applied at the control gate of the select transistor of the third memory cell, the read voltage is applied on the first bit line and the first source line, and a voltage lower in magnitude than the read voltage is applied at the second source line.

Disclosed also is a method of operating a non-volatile memory cell in a memory device. The method includes writing a '1' in a first resistive element of the memory cell by pulsing a supply voltage on a first word line and applying a voltage on a first source line that is lower in magnitude than a voltage on a second source line and a voltage on the second source line that is lower in magnitude than a voltage at a bit line, in which the first word line is coupled to a control gate of a select transistor, the first resistive element is coupled between the first source line and a first current electrode of the select transistor, and a second current electrode of the select transistor is coupled to the bit line.

The method further includes writing a '1' in a second resistive element of the memory cell by pulsing the supply voltage on the first word line and applying a voltage on the second source line that is lower in magnitude than a voltage on the first source line and a voltage on the first source line that is higher in magnitude than a voltage at the bit line, in which the second resistive element is coupled between the second source line and the first current electrode of the select transistor.

Although the invention is described herein with reference to specific embodiments, various modifications and changes can be made without departing from the scope of the present invention as set forth in the claims below. For example, the particular type of non-volatile element can vary from that disclosed. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A non-volatile memory device comprising:
   an array of non-volatile memory cells, wherein a memory cell in the array of non-volatile memory cells includes:
      a first resistive element including a first terminal and a second terminal;
      a second resistive element including a first terminal and a second terminal; and
      a select transistor including a gate electrode coupled to a word line, a first current electrode coupled to the first terminal of the first resistive element and the first terminal of the second resistive element, and a second current electrode coupled to a bit line, wherein the second terminal of the first resistive element is coupled to a first source line, and the second terminal of the second resistive element is coupled to a second source line;
   a first segmentation transistor including a first current electrode coupled to the first source line, a second current electrode coupled to a global source line, and a control electrode coupled to a first local source line enable signal, wherein the first segmentation transistor couples the first source line to the global source line when the first local source line enable signal is set to place the first segmentation transistor in a conductive mode.

2. The non-volatile memory device of claim 1, wherein the first and second resistive elements are magnetic tunnel junction resistors.

3. The non-volatile memory device of claim 1, wherein:
   to write a '1' in the first resistive element, voltage on the word line is pulsed, voltage on the first source line is lower in magnitude than voltage on the second source line, and voltage on the second source line is lower in magnitude than voltage at the bit line.

4. The non-volatile memory device of claim 1, wherein:
   to write a '0' in the first resistive element, voltage on the word line is pulsed, voltage on the first source line is higher in magnitude than voltage on the second source line, and voltage on the second source line is higher in magnitude than voltage at the bit line.

5. The non-volatile memory device of claim 1, wherein:
   to write a '1' in the second resistive element, voltage on the word line is pulsed, voltage on the second source line is higher in magnitude than voltage on the first source line, and voltage on the second source line is lower in magnitude than voltage at the bit line.

6. The non-volatile memory device of claim 1, wherein:
   to write a '0' in the second resistive element, voltage on the word line is pulsed, voltage on the second source line is higher in magnitude than voltage on the first source line, and voltage on the first source line is higher in magnitude than voltage at the bit line.

7. The non-volatile memory device of claim 1, further comprising:
   a second segmentation transistor including a first current electrode coupled to the second source line, a second current electrode coupled to the global source line, and a control electrode coupled to a second local source line enable signal, wherein the second segmentation transistor couples the second source line to the global source line when the second local source line enable signal is set to place the second segmentation transistor in a conductive mode.

8. The non-volatile memory device of claim 1, wherein:
   to read the first resistive element, a read voltage is applied on the bit line and the second source line, and a voltage lower in magnitude than the read voltage is applied at the first source line.

9. The non-volatile memory device of claim 1, wherein
   to read the second resistive element, a read voltage is applied on the bit line and the first source line, and a voltage lower in magnitude than the read voltage is applied at the second source line.

10. An integrated circuit comprising:
    an array of non-volatile memory cells including a first row of memory cells and a first column of memory cells, wherein each memory cell in the array of memory cells is configured to store two bits of information at a time, and
    a first memory cell in the first row and the first column includes:
       a select transistor including a control gate coupled to a first word line and a first current electrode coupled to a first bit line;
       a first resistive element including a first terminal coupled to a second current electrode of the select transistor and a second terminal coupled to a first source line; and
       a second resistive element including a first terminal coupled to the second current electrode of the select transistor and a second terminal coupled to a second source line.

11. The integrated circuit of claim 10 further comprising:
a second memory cell in the first row and the non-volatile second column that includes:
  a select transistor including a control gate coupled to a second word line and a first current electrode coupled to the first bit line;
  a first resistive element including a first terminal coupled to a second current electrode of the select transistor and a second terminal coupled to a third source line; and
  a second resistive element including a first terminal coupled to the second current electrode of the select transistor and a second terminal coupled to a fourth source line.

12. The integrated circuit of claim 11 further comprising:
a third memory cell in a second row of memory cells and the first column that includes:
  a select transistor including a control gate coupled to a third word line and a first current electrode coupled to the first bit line;
  a first resistive element including a first terminal coupled to a second current electrode of the select transistor and a second terminal coupled to the first source line; and
  a second resistive element including a first terminal coupled to the second current electrode of the select transistor and a second terminal coupled to the second source line.

13. The integrated circuit of claim 12, wherein the first and second resistive elements in the first, second, and third memory cells are magnetic tunnel junction resistors.

14. The integrated circuit of claim 10, wherein:
to write a '1' in the first resistive element of the first memory cell, voltage on the first word line is pulsed, voltage on the first source line is lower in magnitude than voltage on the second source line, and voltage on the second source line is lower in magnitude than voltage at the first bit line; and
to write a '0' in the first resistive element of the first memory cell, voltage on the first word line is pulsed, voltage on the first source line is higher in magnitude than voltage on the second source line, and voltage on the second source line is higher in magnitude than voltage at the first bit line.

15. The integrated circuit of claim 11, wherein:
to write a '1' in the first resistive element of the second memory cell, voltage on the second word line is pulsed, voltage on a third source line is lower in magnitude than voltage on a fourth source line, and voltage on the fourth source line is lower in magnitude than voltage at the first bit line; and
to write a '0' in the first resistive element of the second memory cell, voltage on the second word line is pulsed, voltage on the third source line is higher in magnitude than voltage on the fourth source line, and voltage on the fourth source line is higher in magnitude than voltage at second bit line.

16. The integrated circuit of claim 12, wherein:
to write a '1' in the first resistive element of the third memory cell, voltage on the third word line is pulsed, voltage on the first source line is lower in magnitude than voltage on the second source line, and voltage on the second source line is lower in magnitude than voltage at the first bit line; and
to write a '0' in the first resistive element of the third memory cell, voltage on the third word line is pulsed, voltage on the first source line is higher in magnitude than voltage on the second source line, and voltage on the second source line is higher in magnitude than voltage at the first bit line.

17. The integrated circuit of claim 10, further comprising:
a first segmentation transistor including a first current electrode coupled to the first source line, a second current electrode coupled to a global source line, and a control electrode coupled to a first local source line enable signal, wherein the first segmentation transistor couples the first source line to the global source line when the first local source line enable signal is set to place the first segmentation transistor in a conductive mode; and
a second segmentation transistor including a first current electrode coupled to the second source line, a second current electrode coupled to the global source line, and a control electrode coupled to a second local source line enable signal, wherein the second segmentation transistor couples the second source line to the global source line when the second local source line enable signal is set to place the second segmentation transistor in a conductive mode.

18. The integrated circuit of claim 12, wherein:
to read the first resistive element of the first memory cell, a supply voltage is applied at the control gate of the select transistor of the first memory cell, a read voltage is applied on the first bit line and the second source line, and a voltage lower in magnitude than the read voltage is applied at the first source line;
to read the second resistive element of the first memory cell, the supply voltage is applied at the control gate of the select transistor of the first memory cell, the read voltage is applied on the first bit line and the first source line, and a voltage lower in magnitude than the read voltage is applied at the second source line;
to read the first resistive element of the second memory cell, the supply voltage is applied at the control gate of the select transistor of the second memory cell, the read voltage is applied on the first bit line and the fourth source line, and a voltage lower in magnitude than the read voltage is applied at the third source line;
to read the second resistive element of the second memory cell, the supply voltage is applied at the control gate of the select transistor of the second memory cell, the read voltage is applied on the first bit line and the third source line, and a voltage lower in magnitude than the read voltage is applied at the fourth source line;
to read the first resistive element of the third memory cell, the supply voltage is applied at the control gate of the select transistor of the third memory cell, the read voltage is applied on the first bit line and the second source line, and a voltage lower in magnitude than the read voltage is applied at the first source line; and
to read the second resistive element of the third memory cell, the supply voltage is applied at the control gate of the select transistor of the third memory cell, the read voltage is applied on the first bit line and the first source line, and a voltage lower in magnitude than the read voltage is applied at the second source line.

19. A method of operating a non-volatile memory cell in a memory device, the method comprising:
writing a '1' in a first resistive element of the memory cell by pulsing a supply voltage on a first word line, applying a voltage on a first source line that is lower in magnitude than a voltage on a second source line and a voltage on the second source line that is lower in magnitude than a voltage at a bit line, wherein the first word line is coupled to a control gate of a select transistor, the first resistive element is coupled between the first source line and a first current electrode of the select transistor, and a second current electrode of the select transistor is coupled to the bit line; and writing a '1' in a second resistive element of the memory cell by pulsing the supply voltage on the first word line, and applying a voltage on the second source line that is lower in magnitude than a voltage on the first source line and applying a voltage on the first source line that is higher in magnitude than a voltage at the bit line, wherein the second resistive element is coupled between the second source line and the first current electrode of the select transistor.

\* \* \* \* \*